US012754234B2

(12) United States Patent
Borisov et al.

(10) Patent No.: US 12,754,234 B2
(45) Date of Patent: Oct. 6, 2026

(54) LOGIC BOARD FOR VARIABLE SPEED DRIVE

(71) Applicants: Johnson Controls Tyco IP Holdings LLP, Milwaukee, WI (US); Johnson Controls Air Conditioning and Refrigeration (Wuxi) Co., Ltd., Wuxi (CN)

(72) Inventors: Konstantin Alex Borisov, York, PA (US); JonPaul Warriner, York, PA (US); Anuradha Girish Ogale, York, PA (US); Chenyi Jiang, Wuxi (CN); Fei Lu, Wuxi (CN)

(73) Assignees: Johnson Controls Air Conditioning and Refrigeration (Wuxi) Co., Ltd., Wuxi (CN); Tyco Fire & Security GmbH, Neuhausen am Rheinfall (CH)

( * ) Notice: Subject to any disclaimer, the term of this patent is extended or adjusted under 35 U.S.C. 154(b) by 414 days.

(21) Appl. No.: 17/800,501

(22) PCT Filed: Feb. 21, 2020

(86) PCT No.: PCT/CN2020/076102

§ 371 (c)(1),
(2) Date: Aug. 17, 2022

(87) PCT Pub. No.: WO2021/163981

PCT Pub. Date: Aug. 26, 2021

(65) Prior Publication Data

US 2023/0080482 A1 Mar. 16, 2023

(51) Int. Cl.

*G01R 31/317* (2006.01)
*H02P 29/00* (2016.01)

(52) U.S. Cl.

CPC ............ *G01R 31/317* (2013.01); *H02P 29/00* (2013.01)

(58) Field of Classification Search

CPC ........ H02P 29/00; G01R 31/317; F24F 11/86; F25B 1/00; F25B 2339/047; Y02B 30/70;

(Continued)

(56) References Cited

U.S. PATENT DOCUMENTS

| | | | |
|---|---|---|---|
| 4,458,841 | A | 7/1984 | Laakaniemi et al. |
| 5,574,730 | A | 11/1996 | End et al. |

(Continued)

FOREIGN PATENT DOCUMENTS

| | | | |
|---|---|---|---|
| CA | 2095400 | A1 | 11/1993 |
| CN | 1632399 | | 6/2005 |

(Continued)

OTHER PUBLICATIONS

Japanese Office Action for JP Application No. 2022-550126, dated Sep. 20, 2023, 3 pages.

(Continued)

*Primary Examiner* — Said Bouziane
(74) *Attorney, Agent, or Firm* — Fletcher Yoder, P.C.

(57) ABSTRACT

Embodiments of the present disclosure relate to an electronic identification system of a logic board for use in variable speed drives. Specifically, the present disclosure relates to a logic board for a variable speed drive having a configuration block that includes a plurality of resistors, a control system communicatively coupled to and configured to receive a signal from the configuration block, where the control system is configured to decode the signal to generate data indicative of an identity of the logic board, and a communication interface coupled to the control system, where the communication interface is configured to provide the data indicative of the identity of the logic board to an operator.

17 Claims, 8 Drawing Sheets

(58) Field of Classification Search
CPC ...... H05K 2201/09927; H05K 1/0266; H02M 5/458
See application file for complete search history.

(56) References Cited

U.S. PATENT DOCUMENTS

| | | | |
|---|---|---|---|
| 2009/0160382 A1 | 6/2009 | Hwang et al. | |
| 2019/0334543 A1 | 10/2019 | Luo | |

FOREIGN PATENT DOCUMENTS

| | | | | |
|---|---|---|---|---|
| CN | 102231616 A | * 11/2011 | | G06F 13/00 |
| CN | 203706198 U | 7/2014 | | |
| CN | 104052371 A | 9/2014 | | |
| CN | 106482215 A | 3/2017 | | |
| JP | H06132962 A | 5/1994 | | |
| JP | 2007328182 A | 12/2007 | | |
| JP | 2019134606 A | 8/2019 | | |
| KR | 20050043154 | 5/2005 | | |
| WO | 2019161399 A1 | 8/2019 | | |

OTHER PUBLICATIONS

European Office Action for EP Application No. 20920402.3, dated Dec. 7, 2023, 11 pages.

Chinese Office Action for CN Application No. 202080097237.X, dated Jan. 31, 2024, 9 pages.

Xuetao Yu, "Design of PLC based Automatic Control System for Electronic Network Communication Equipment", Modern Electronics Technique, No. 22, Nov. 15, 2017, pp. 115-117.

PCT International Search Report and Written Opinion for PCT Application No. PCT/CN2020/076102, mailed Nov. 25, 2020, 9 pgs.

* cited by examiner

LOGIC BOARD FOR VARIABLE SPEED DRIVE

CROSS-REFERENCE TO RELATED APPLICATIONS

This application is a U.S. National Stage Application of International Application No. PCT/CN2020/076102, entitled "LOGIC BOARD FOR VARIABLE SPEED DRIVE," filed Feb. 21, 2020, which is hereby incorporated by reference in its entirety for all purposes.

BACKGROUND

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

A chiller system for applications in commercial or industrial heating, ventilation, air conditioning, and refrigeration (HVAC&R) systems typically includes a relatively large motor for powering a compressor. A power output of the motor may be selected based on a capacity (e.g., a cooling demand) of the HVAC&R system. For example, the power output of the motor may range in horsepower (HP) from 100 HP to 5,000 HP, or greater than 5,000 HP. Many of these systems include a variable speed drive (VSD) for controlling a speed of the motor in response to variations in the cooling demand of the HVAC&R system. The VSD may increase the speed of the motor and, thus, a speed of the compressor when the cooling demand of the HVAC&R system is increased. Conversely, the VSD may decrease the speed of the motor when the cooling demand of the HVAC&R system is decreased.

A threshold power output of the motor may determine a size (e.g., a power output range) of the VSD. For example, a relatively high powered motor may be controlled by a VSD capable of supporting a higher current draw and voltage demand than a VSD for controlling a relatively low powered motor. Accordingly, different sizes of VSDs may be included in the HVAC&R system to accommodate motors operating over a wide power output range. Each size of VSD may include a logic board (e.g., printed circuit board) that controls operation of the VSD. In some cases, the logic board may include various programming and/or instructions that are specific to the associated size of the VSD. Unfortunately, existing HVAC&R systems do not enable the logic board to be identified electronically. As such, identifying the logic board of the VSD for existing HVAC&R systems may include manual observation of the logic board, which may increase a likelihood of operators misidentifying the correct logic board and/or otherwise increase the time associated with identifying the logic board.

SUMMARY

The present disclosure relates to an electronic identification system of a logic board for use in variable speed drives. Specifically, the present disclosure relates to a logic board for a variable speed drive having a configuration block that includes a plurality of resistors, a control system communicatively coupled to and configured to receive a signal from the configuration block, where the control system is configured to decode the signal to generate data indicative of an identity of the logic board, and a communication interface coupled to the control system, where the communication interface is configured to provide the data indicative of the identity of the logic board to an operator or to another logic board.

The present disclosure also relates to an electronic identification system for a logic board that includes a power source configured to output an electric voltage and a plurality of resistors electrically coupled to the power source and communicatively coupled to a control system of the logic board. One or more pairs of resistors of the plurality of resistors is configured to establish a voltage differential between the power source and a ground point, and the control system is configured to receive the voltage differential from the one or more pairs of resistors of the plurality of resistors.

The present disclosure further relates to a method of identifying a logic board that includes establishing a first voltage differential across a first pair of resistors disposed between a power source and a ground point, establishing a second voltage differential across a second pair of resistors disposed between the power source and the ground point, directing a signal indicative of the first voltage differential and the second voltage differential to a control system of the logic board, and decoding the signal to generate data indicative of an identity of the logic board.

BRIEF DESCRIPTION OF THE DRAWINGS

Various aspects of this disclosure may be better understood upon reading the following detailed description and upon reference to the drawings in which.

DETAILED DESCRIPTION

Figure 1:
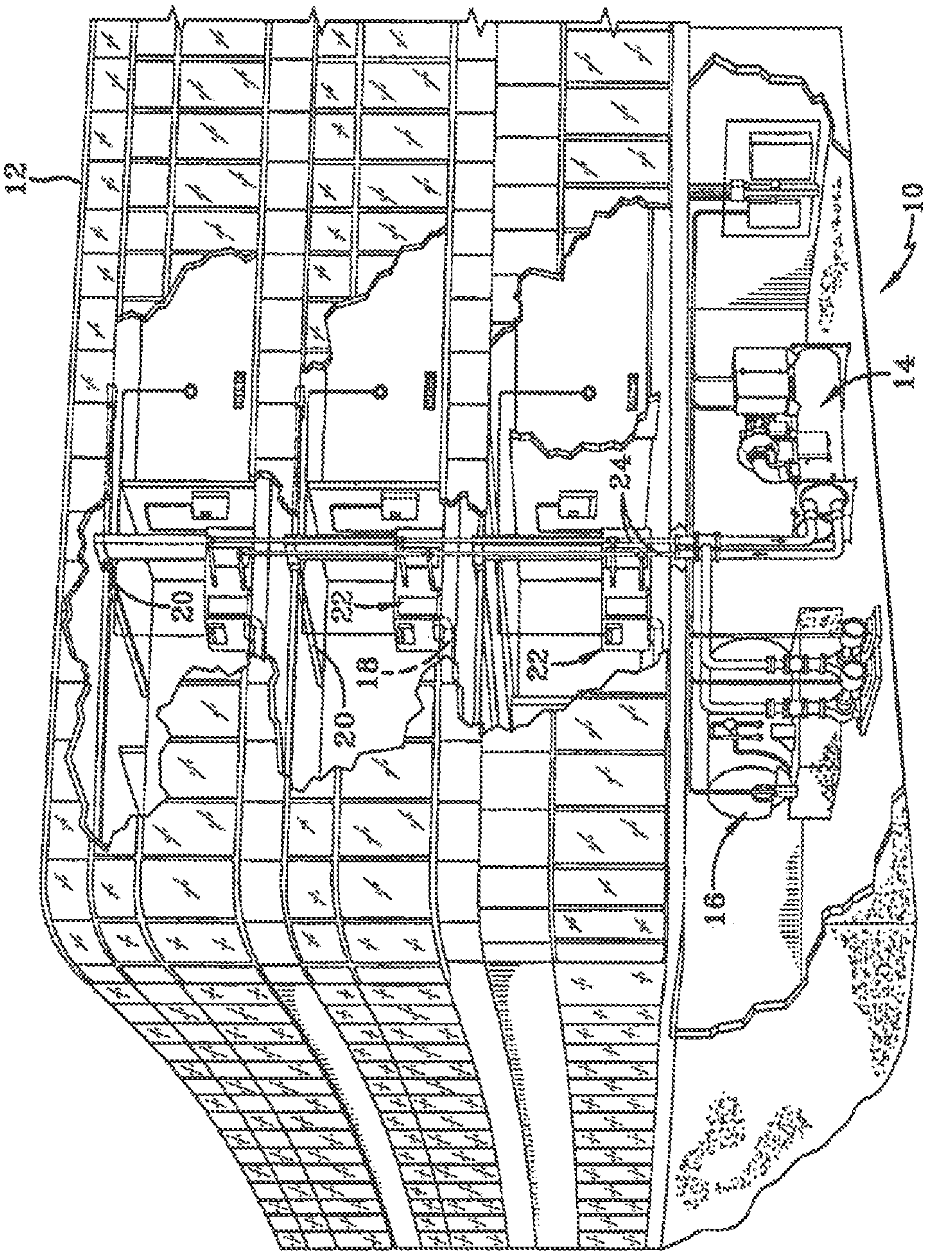
FIG. 1 is a perspective view of an embodiment of a building that may utilize a heating, ventilating, air conditioning, and refrigeration (HVAC&R) system in a commercial setting, in accordance with an aspect of the present disclosure.

One or more specific embodiments of the present disclosure will be described below. These described embodiments are only examples of the presently disclosed techniques.

Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

A heating, ventilation, air conditioning, and refrigeration (HVAC&R) system may be used to thermally regulate a space within a building, home, or other suitable structure. For example, the HVAC&R system may include a vapor compression system that transfers thermal energy between a heat transfer fluid, such as a refrigerant, and a fluid to be conditioned, such as air. The vapor compression system may include a condenser and an evaporator that are fluidly coupled to one another via a conduit. A compressor may be used to circulate the refrigerant through the conduit and, thus, enable the transfer of thermal energy between the condenser and the evaporator.

In many cases, the compressor of the HVAC&R system may be driven by a motor. The motor may be communicatively coupled to a control system, including a variable speed drive (VSD). The control system may accelerate the motor from zero revolutions per minute (RPM) to a threshold speed. In some cases, the control system may further regulate a magnitude of the threshold speed during operation of the HVAC&R system. A power output of the motor may be selected based on a capacity (e.g., a cooling demand) of the HVAC&R system. In some cases, a size of the VSD is proportional to the power output of the motor. For example, a relatively large motor may be controlled by a VSD capable of supplying a larger electric current and voltage than a VSD configured to control a relatively small motor. Accordingly, several sizes of the VSD may be used with the HVAC&R system to control a wide range of motors that have varying power output thresholds.

Each VSD may include a logic board (e.g., a printed circuit board (PCB)) that may monitor and/or control certain operational parameters of the respective VSD. For example, the logic board may monitor a magnitude of electric current and/or voltage drawn by the VSD (e.g., from a power supply), a magnitude of electric current and/or voltage supplied by the VSD (e.g., to the motor), or both. Further, the logic board may store predetermined (e.g., preprogrammed) threshold values associated with certain monitored operational parameters of the VSD. The logic board may compare the monitored operational parameters to the threshold values and may control operation of the VSD (e.g., adjust operation of components of the VSD and/or shut down the VSD) based on results of the comparison. A particular logic board may be configured to accommodate a particular size of VSD, such that the logic board is configured to monitor operating parameters of the particular size of VSD. For example, a logic board configured to monitor operational parameters of a relatively large VSD may be preprogrammed with relatively high threshold values (e.g., threshold values associated with monitored operational parameters of the VSD) to enable the VSD to operate more effectively at relatively high loads. Similarly, another logic board configured to monitor operational parameters of a relatively small VSD may be programmed with relatively low threshold values (e.g., threshold values associated with monitored operational parameters of the VSD) to enable the VSD to operate more effectively at relatively small loads. Additionally, a particular logic board may be configured to accommodate particular fault handling mechanisms or other features associated with retrofit or non-retrofit versions of the logic board. Accordingly, one of several logic boards may be included in the HVAC&R system, each including different internal components and/or programming associated with a particular size of VSD. During maintenance and/or assembly of the HVAC&R system, an operator may be tasked with determining the type of particular logic board (e.g., such as a PCB revision of the logic board) that is utilized to control and/or otherwise monitor the VSD of the HVAC&R system. Unfortunately, existing HVAC&R systems do not include an electronic identification system that enables an operator to determine the type of logic board of the HVAC&R system and/or the PCB revision of the logic board without manual, visual inspection by the operator. Particularly, existing HVAC&R systems do not enable identification features of the logic board, such as a line number (e.g., corresponding to a size of the VSD), a VSD revision, and/or a PCB revision, to be identified electronically.

Embodiments of the present disclosure are directed to an electronic identification system for a logic board (e.g., printed circuit board). In some embodiments, the electronic identification system may be added as additional components in existing logic boards. The electronic identification system may include a plurality of resistors that is communicatively coupled to a control device (e.g., a field programmable gate array) of the logic board. The plurality of resistors may be incorporated into a portion of the logic board and/or a separate printed circuit board that is in communication with the control device of the logic board. The plurality of resistors is configured to direct a signal to the control system indicative of an identity of the particular logic board that is being utilized. In some embodiments, the signal may include a plurality of voltages and/or voltage differentials that each represent a particular characteristic of the logic board (e.g., a base number, a line number, a bill of materials (BOM) revision level, and/or a bare PCB revision level). In some embodiments, the plurality of voltages and/or voltage differentials may be expressed as a binary code that enables the control system to determine the identity of and/or the particular characteristics of the logic board and to direct an additional signal to a user interface device (e.g., via a secure digital card, a wireless communication, and/or another communication interface). As such, the operator may quickly and accurately identify the particular logic board, such that appropriate maintenance may be performed in accordance with the identified logic board. In some cases, different troubleshooting processes and/or maintenance procedures may be utilized for different types of logic boards. Accordingly, the electronic identification system of the present disclosure may facilitate maintenance operations and reduce maintenance costs and maintenance time of the HVAC&R system.

Turning now to the drawings, FIG. 1 is a perspective view of an embodiment of an environment for a heating, ventilation, air conditioning, and refrigeration (HVAC&R) system 10 in a building 12 for a typical commercial setting. The HVAC&R system 10 may include a vapor compression system 14 (e.g., a chiller) that supplies a chilled liquid, which may be used to cool the building 12. The HVAC&R system 10 may also include a boiler 16 to supply warm liquid to heat the building 12 and an air distribution system which circulates air through the building 12. The air distribution system can also include an air return duct 18, an air supply duct 20, and/or an air handler 22. In some embodiments, the air handler 22 may include a heat exchanger that is connected to the boiler 16 and the vapor compression system 14 by conduits 24. The heat exchanger in the air handler 22 may receive either heated liquid from the boiler 16 or chilled liquid from the vapor compression system 14, depending on the mode of operation of the HVAC&R system 10. The HVAC&R system 10 is shown with a separate air handler on each floor of building 12, but in other embodiments, the HVAC&R system 10 may include air handlers 22 and/or other components that may be shared between or among floors.

Figure 2:
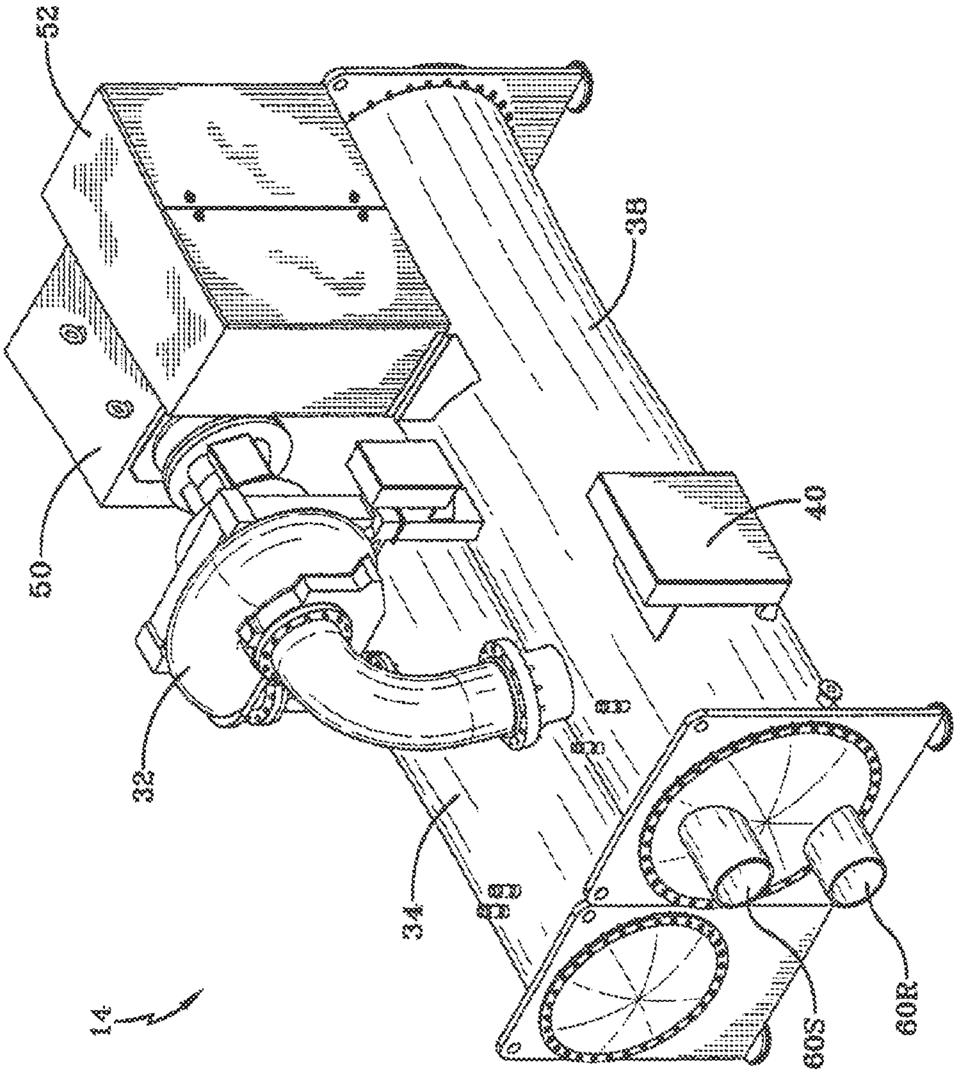
FIG. 2 is a perspective view of an embodiment of a vapor compression system, in accordance with an aspect of the present disclosure.
Figure 3:
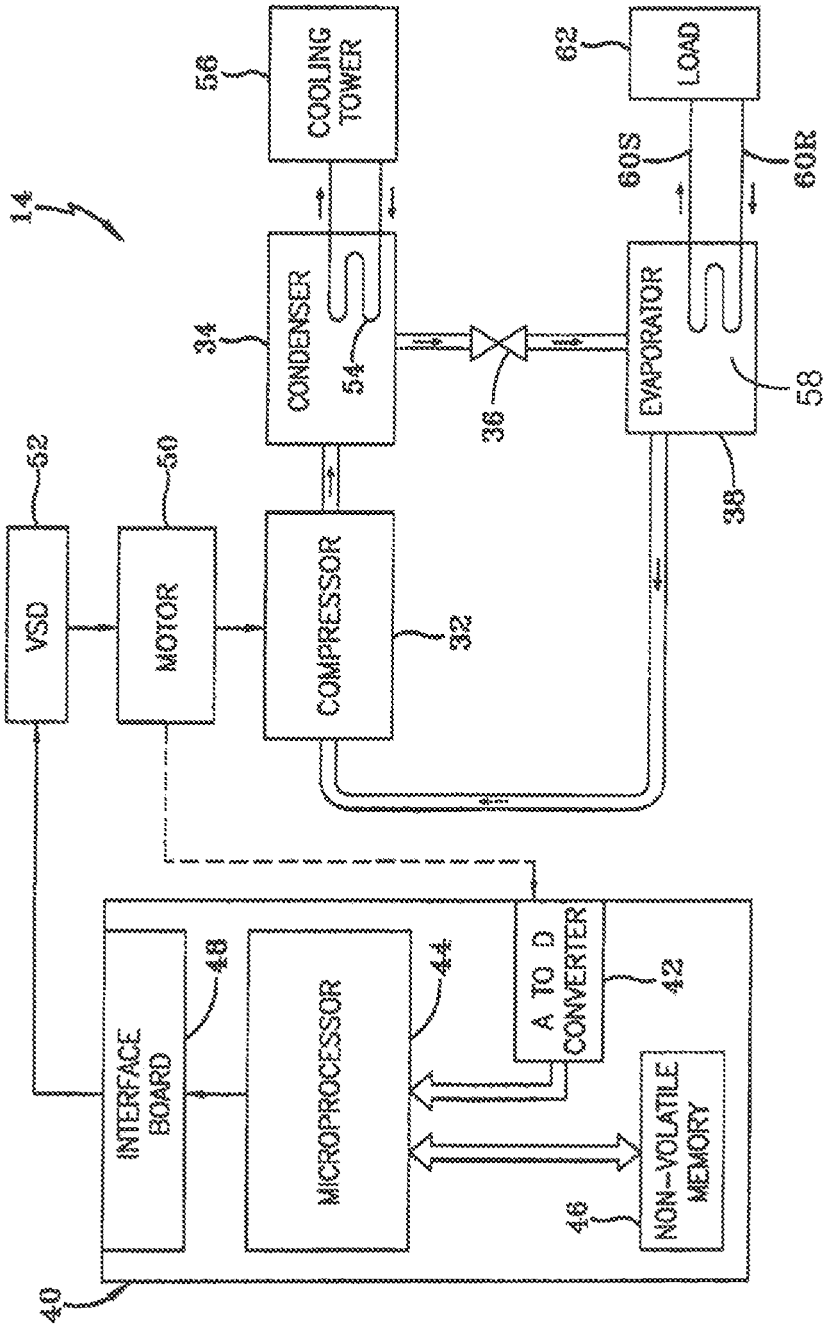
FIG. 3 is a schematic of an embodiment of the vapor compression system of FIG. 2, in accordance with an aspect of the present disclosure.

FIGS. 2 and 3 are embodiments of the vapor compression system 14 that can be used in the HVAC&R system 10. The vapor compression system 14 may circulate a refrigerant through a circuit starting with a compressor 32. The circuit may also include a condenser 34, an expansion valve(s) or device(s) 36, and a liquid chiller or an evaporator 38. The vapor compression system 14 may further include a control panel 40 that has an analog to digital (A/D) converter 42, a microprocessor 44, a non-volatile memory 46, and/or an interface board 48.

Some examples of fluids that may be used as refrigerants in the vapor compression system 14 are hydrofluorocarbon (HFC) based refrigerants, for example, R-410A, R-407, R-134a, hydrofluoro olefin (HFO), "natural" refrigerants like ammonia ($NH_3$), R-717, carbon dioxide ($CO_2$), R-744, or hydrocarbon based refrigerants, water vapor, or any other suitable refrigerant. In some embodiments, the vapor compression system 14 may be configured to efficiently utilize refrigerants having a normal boiling point of about 19 degrees Celsius (66 degrees Fahrenheit) at one atmosphere of pressure, also referred to as low pressure refrigerants, versus a medium pressure refrigerant, such as R-134a. As used herein, "normal boiling point" may refer to a boiling point temperature measured at one atmosphere of pressure.

In some embodiments, the vapor compression system 14 may use one or more of a variable speed drive (VSDs) 52, a motor 50, the compressor 32, the condenser 34, the expansion valve or device 36, and/or the evaporator 38. The motor 50 may drive the compressor 32 and may be powered by a variable speed drive (VSD) 52. The VSD 52 receives alternating current (AC) power having a particular fixed line voltage and fixed line frequency from an AC power source, and provides power having a variable voltage and frequency to the motor 50. In other embodiments, the motor 50 may be powered directly from an AC or direct current (DC) power source. The motor 50 may include any type of motor that can be powered by a VSD or directly from an AC or DC power source, such as a switched reluctance motor, an induction motor, an electronically commutated permanent magnet motor, or another suitable motor.

The compressor 32 compresses a refrigerant vapor and delivers the vapor to the condenser 34 through a discharge passage. In some embodiments, the compressor 32 may be a centrifugal compressor. The refrigerant vapor delivered by the compressor 32 to the condenser 34 may transfer heat to a cooling fluid (e.g., water or air) in the condenser 34. The refrigerant vapor may condense to a refrigerant liquid in the condenser 34 as a result of thermal heat transfer with the cooling fluid. The liquid refrigerant from the condenser 34 may flow through the expansion device 36 to the evaporator 38. In the illustrated embodiment of FIG. 3, the condenser 34 is water cooled and includes a tube bundle 54 connected to a cooling tower 56, which supplies the cooling fluid to the condenser 34.

The liquid refrigerant delivered to the evaporator 38 may absorb heat from another cooling fluid, which may or may not be the same cooling fluid used in the condenser 34. The liquid refrigerant in the evaporator 38 may undergo a phase change from the liquid refrigerant to a refrigerant vapor. As shown in the illustrated embodiment of FIG. 3, the evaporator 38 may include a tube bundle 58 having a supply line 60S and a return line 60R connected to a cooling load 62. The cooling fluid of the evaporator 38 (e.g., water, ethylene glycol, calcium chloride brine, sodium chloride brine, or any other suitable fluid) enters the evaporator 38 via return line 60R and exits the evaporator 38 via supply line 60S. The evaporator 38 may reduce the temperature of the cooling fluid in the tube bundle 58 via thermal heat transfer with the refrigerant. The tube bundle 58 in the evaporator 38 can include a plurality of tubes and/or a plurality of tube bundles. In any case, the vapor refrigerant exits the evaporator 38 and returns to the compressor 32 by a suction line to complete the cycle.

Figure 4:
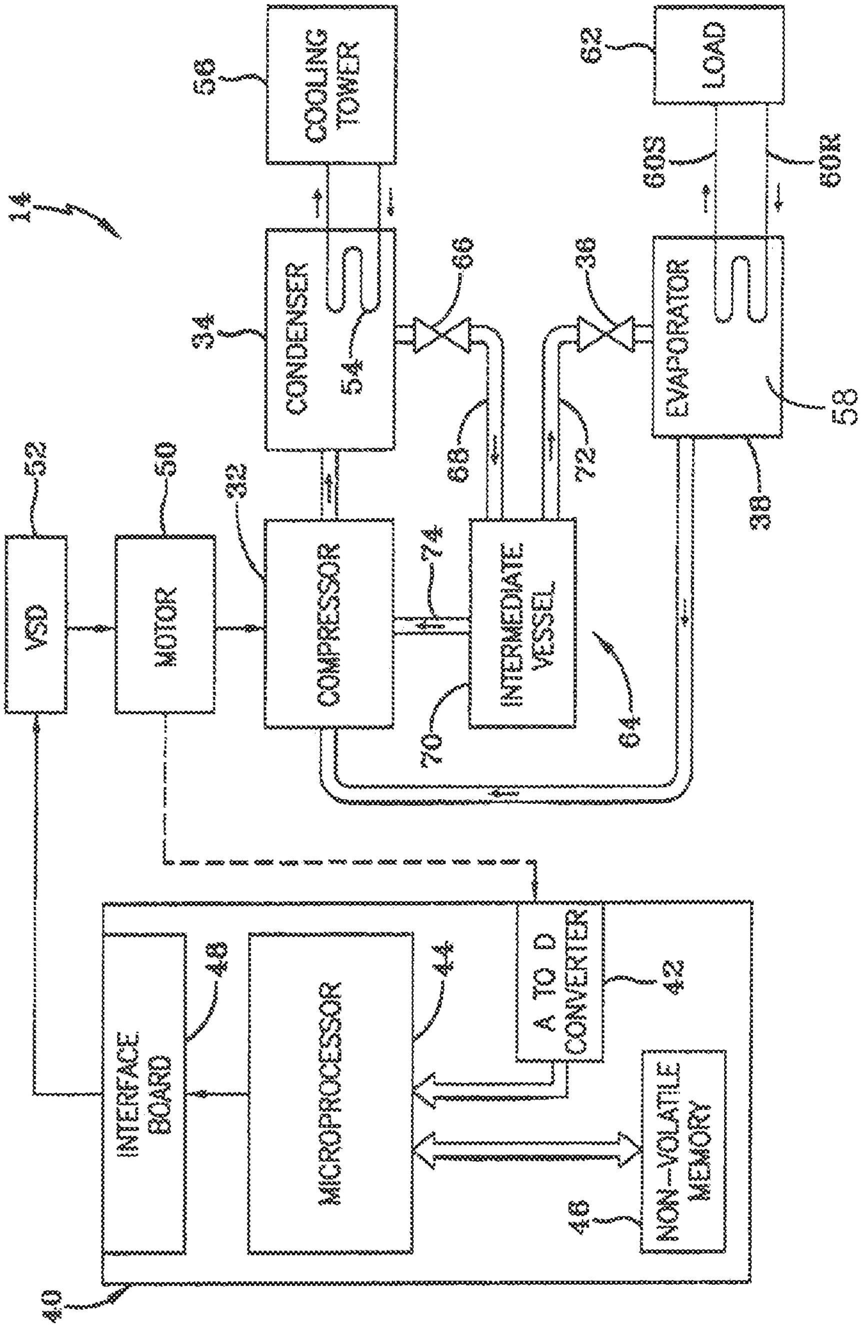
FIG. 4 is a schematic of an embodiment of the vapor compression system of FIG. 2, in accordance with an aspect of the present disclosure.

FIG. 4 is a schematic of the vapor compression system 14 with an intermediate circuit 64 incorporated between condenser 34 and the expansion device 36. The intermediate circuit 64 may have an inlet line 68 that is directly fluidly connected to the condenser 34. In other embodiments, the inlet line 68 may be indirectly fluidly coupled to the condenser 34. As shown in the illustrated embodiment of FIG. 4, the inlet line 68 includes a first expansion device 66 positioned upstream of an intermediate vessel 70. In some embodiments, the intermediate vessel 70 may be a flash tank (e.g., a flash intercooler). In other embodiments, the intermediate vessel 70 may be configured as a heat exchanger or a "surface economizer." In the illustrated embodiment of FIG. 4, the intermediate vessel 70 is used as a flash tank, and the first expansion device 66 is configured to lower the pressure of (e.g., expand) the liquid refrigerant received from the condenser 34. During the expansion process, a portion of the liquid may vaporize, and thus, the intermediate vessel 70 may be used to separate the vapor from the liquid received from the first expansion device 66.

Additionally, the intermediate vessel 70 may provide for further expansion of the liquid refrigerant because of a pressure drop experienced by the liquid refrigerant when entering the intermediate vessel 70 (e.g., due to a rapid increase in volume experienced when entering the intermediate vessel 70). The vapor in the intermediate vessel 70 may be drawn by the compressor 32 through a suction line 74 of the compressor 32. In other embodiments, the vapor in the intermediate vessel may be drawn to an intermediate stage of the compressor 32 (e.g., not the suction stage). The liquid that collects in the intermediate vessel 70 may be at a lower enthalpy than the liquid refrigerant exiting the condenser 34 because of the expansion in the expansion device 66 and/or the intermediate vessel 70. The liquid from intermediate vessel 70 may then flow in line 72 through a second expansion device 36 to the evaporator 38.

It should be appreciated that any of the features described herein may be incorporated with the vapor compression system 14 or any other suitable HVAC&R systems. As discussed above, embodiments of the present disclosure are directed to an electronic identification system for a logic board of the VSD 52. The size of the VSD 52 may be indicative of a magnitude of a power output range (e.g., supply current, supply voltage) that the VSD 52 is configured to generate. For example, a larger VSD may be used to control operation of a relatively large motor (e.g., a 5,000 horsepower (HP) motor). Conversely, a smaller VSD may be used to operate a relatively small motor (e.g., a 100 HP motor). In some embodiments, the logic board may monitor and/or control operating parameters of the VSD 52 and/or include programming or instructions that enable the logic board to control the VSD 52 having a particular size. As such, different logic boards may be included in the VSD 52 based on the size of the VSD 52. Indeed, the logic board may include programming, fault handling systems, and/or other instructions that enable the logic board to control the VSD 52 having a particular size in retrofit and non-retrofit applications. As such, different logic boards may be included in the VSD 52 based on a particular size of the VSD 52 and/or based on whether the logic board is applied in retrofit or non-retrofit applications on the VSD. Existing systems do not include an identification system outside of visual, physical labels or PCB etching, that an operator may view to determine the particular type of logic board. Embodiments of the present disclosure are directed to an electronic identification system that may display and/or otherwise generate a signal that may facilitate identification of the particular logic board of the VSD 52. For example, the electronic identification system may include a plurality of resistors that generate corresponding voltages and/or voltage differentials indicative of the identity and/or characteristics of the logic board. The plurality of resistors may be communicatively coupled to a controller (e.g., a field programmable gate array) of the logic board, which may be communicatively coupled to a display, external memory device, and/or an operator device to provide identification information associated with the logic board to the operator. Thus, a likelihood of misidentifying the logic board may be reduced, enabling maintenance times and costs of the HVAC&R system to also be reduced.

Figure 5:
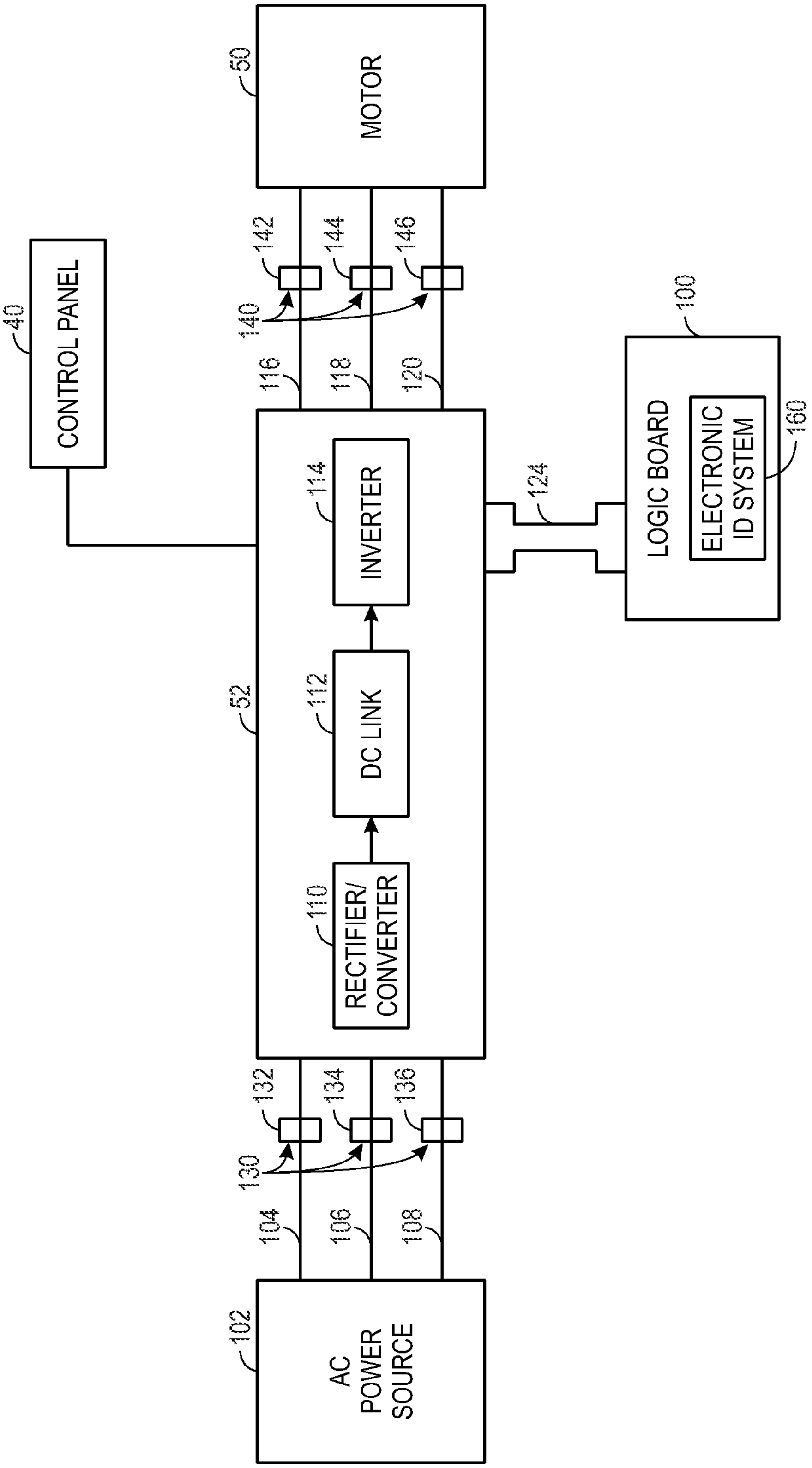
FIG. 5 is a schematic of an embodiment of a general configuration of a variable speed drive (VSD) that may be used in the vapor compression systems of FIGS. 2-4, in accordance with an aspect of the present disclosure.

With the foregoing in mind, FIG. 5 is a schematic diagram of an embodiment of the VSD 52 including a logic board 100, which may be used to control the motor 50 of the vapor compression systems 14 of FIGS. 1-4. An alternating current (AC) power source 102 may supply AC power to the VSD 52, which in turn supplies AC power to the motor 50. The AC power source 102 may provide three-phase, fixed voltage, and fixed frequency AC power to the VSD 52 from an AC power grid or distribution system. For example, the AC power source 102 may provide a first phase of AC power, a second phase of AC power, and a third phase of AC power through a first receiving line 104, a second receiving line 106, and a third receiving line 108, respectively.

The AC power may be supplied directly from an electric utility or from one or more transforming substations between the electric utility and the AC power source 102. In some embodiments, the AC power source 102 may supply a three phase AC voltage, or line voltage, of up to 15 kilovolts (kV) at a line frequency of between 50 Hertz (Hz) and 60 Hz to the VSD 52, depending on the corresponding AC power source 102. However, in other embodiments, the AC power source 102 can provide any suitable fixed line voltage or fixed line frequency to the VSD 52 depending on the configuration of the AC power source 102. In addition, a particular site can have multiple AC power sources that can satisfy different line voltage and line frequency demands.

The VSD 52 directs AC power from the AC power source 102 to the motor 50 at a desired voltage and desired frequency. In certain embodiments, the VSD 52 may provide AC power to the motor 50 having higher voltages and frequencies or lower voltages and frequencies than the fixed voltage and fixed frequency received from the AC power source 102. For example, the VSD 52 may have three internal stages: a converter 110 (e.g., a rectifier), a direct current (DC) link 112, and an inverter 114. The converter 110 may convert the fixed line frequency and/or the fixed line voltage from the AC power source 102 into DC power. The DC link 112 may filter the DC power from the converter 110 and/or store energy via components such as capacitors and/or inductors (not shown). The inverter 114 may convert the DC power from the DC link 112 into variable frequency, variable voltage AC power (e.g., three phase AC power) for the motor 50. For example, the inverter 114 may supply the motor 50 with a first phase of AC power, a second phase of AC power, and a third phase of AC power through a first output line 116, a second output line 118, and a third output line 120, respectively.

In some embodiments, the converter 110 may be a pulse width modulated (PWM) boost converter or rectifier having insulated gate bipolar transistors (IGBTs) to provide a boosted DC voltage to the DC link 112 and produce a fundamental root mean square (RMS) output voltage from the VSD 52 that is greater than a fixed nominal fundamental RMS input voltage to the VSD 52. Furthermore, in some embodiments, the VSD 52 may incorporate additional components from those shown in FIG. 5 to provide the motor 50 with appropriate output voltages and frequencies.

In certain embodiments, the motor 50 may be an induction motor that is capable of being driven at variable speeds. The induction motor can have any suitable pole arrangement including two poles, four poles, six poles, or any suitable number of poles. The induction motor is used to drive a load, such as the compressor 32 of the vapor compression system 14. In other embodiments, the motor 50 may be any suitable motor to drive the compressor 32 and/or another suitable device.

In some embodiments, the logic board 100 may be communicatively coupled to the VSD 52 via a harness 124 or a plurality of harnesses (see, e.g., FIG. 5). The harness 124 may include a plurality of wires (e.g., copper wires, optical fibers), which enable the transmission of data and/or signals between the VSD 52 and the logic board 100. In some embodiments, the logic board 100 may monitor and/or control various operating parameters of the VSD 52, such as a magnitude of an electric current drawn by the VSD 52 from the AC power source 102. For example, the logic board 100 may be communicatively coupled (e.g., via the harness 124) to input current transducers 130, which may be disposed on each of the first receiving line 104, the second receiving line 106, and/or the third receiving line 108. The input current transducers 130 may be used to monitor and/or control the flow of electric current through a power wire (e.g., the first, second, or third receiving lines 104, 106, 108) and generate an output signal (e.g., an electric current) that is proportional to, but less than, the flow of electric current through the respective power wire.

For example, a first input current transducer 132 disposed on the first receiving line 104 may monitor the first phase of AC power flowing through the first receiving line 104. Accordingly, the first input current transducer 132 may output an electric current (e.g., a signal) that is proportional to the magnitude of the first phase of AC power. For example, an amperage of the electric current flowing through the first receiving line 104 may be between 100 amperes (amps) and 2000 amps, while an amperage of the output signal generated by the first input current transducer 132 may be between 1 milliampere (mA) and 2 amps. Similarly, a second input current transducer 134 disposed on the second receiving line 106 may monitor the second phase of AC power flowing through the second receiving line 106, while a third input current transducer 136 disposed on the third receiving line 108 may monitor the third phase of AC power flowing through the third receiving line 108.

The logic board 100 may additionally monitor and/or control a magnitude of the electric current supplied to the motor 50 by the VSD 52. For example, output current transducers 140 may include a first output current transducer 142, a second output current transducer 144, and a third output current transducer 146 disposed on the first output line 116, the second output line 118, and the third output line 120, respectively. Accordingly, the first, second, and third output current transducers 142, 144, and 146 may monitor the first, second, and third phases of AC power flowing through the first, second, and third output lines 116, 118, and 120, respectively. Similar to the input current transducers 130, the output current transducers 140 may each communicatively couple to the logic board 100 via the harness 124.

Figure 6:
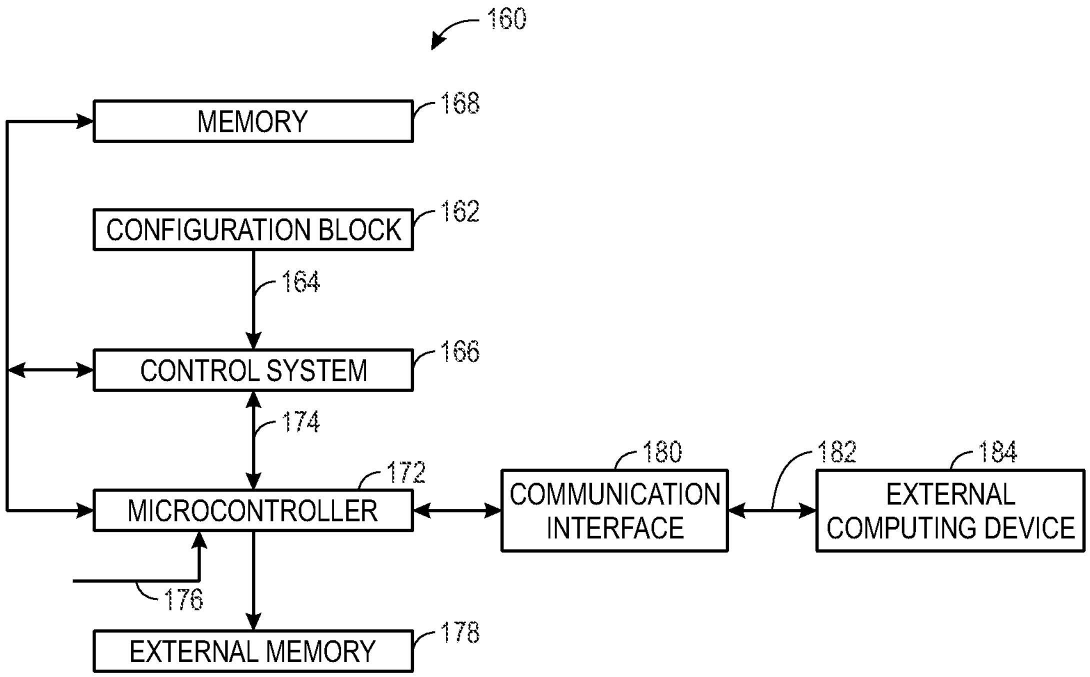
FIG. 6 is a schematic of an embodiment of a logic board identification system, in accordance with an aspect of the present disclosure.

As set forth above, the VSD 52 may include the logic board 100, which may be chosen from a variety of logic boards having different types, models, and/or circuitry based on a size or application (e.g., retrofit or non-retrofit) of the VSD 52. In order to facilitate identification of the logic board 100 used to control operation of the VSD 52, the logic board 100 may include an electronic identification system 160. For example, FIG. 6 is a schematic diagram of an embodiment of the electronic identification system 160 of the logic board 100. As shown in the illustrated embodiment of FIG. 6, the electronic identification system 160 includes a configuration block 162, which is incorporated into the logic board 100. However, it should be understood that, in certain embodiments, the configuration block 162 may be a separate component (e.g., a separate printed circuit board) that is communicatively coupled to the logic board 100. As discussed in further detail below, the configuration block 162 includes a plurality of resistors that provide a signal 164 to a control system 166 (e.g., a field programmable gate array) of the logic board 100. The signal 164 may include a plurality of voltages (e.g., a plurality of voltage differentials) indicative of identification data (e.g., product number, logic board type, base number, line number, bare PCB revision, and/or bill of materials (BOM) revision level) of the logic board 100.

Accordingly, the control system 166 may receive the signal 164 and interpret and/or decode the identification data. For example, the control system 166 may receive the signal 164 as the plurality of voltages and decode and/or interpret each voltage of the plurality of voltages as a bit of data. The bits of data decoded and/or interpreted from the plurality of voltages may be combined with one another by the control system 166 to form a unique sequence corresponding to the particular logic board 100. In some embodiments, the control system 166 is configured to compare the unique sequence generated from the signal 164 to a look up table stored in memory 168 of the logic board 100 to determine information about the logic board 100 that may be interpreted and/or otherwise understood by an operator (e.g., information provided to the operator on a display of an operator device). In some embodiments, the configuration block 162, the control system 166, and/or the memory 168 are communicatively coupled to one another via a wired connection (e.g., a bus and/or an electric cable). In certain embodiments, suitable connectors may be used to communicatively couple the configuration block 162, the control system 166, and/or the memory 168 to one another. For example, when the configuration block 162 is a component (e.g., a PCB) separate of the logic board 100, connectors may be used to communicatively couple the configuration block 162 to the logic board 100. In other embodiments, the configuration block 162, the control system 166, and/or the memory 168 are communicatively coupled to one another via a wireless connection.

In some embodiments, the control system 166 may direct the identification data, the signal 164, and/or information related to the logic board 100 to a microcontroller 172 via a second signal 174. The microcontroller 172 may be configured to receive additional inputs 176 from sensors and/or sensing devices of the logic board 100 and/or the VSD 52 that monitor operating parameters of the VSD 52. The microcontroller 172 may utilize the additional inputs 176 in addition to the identification data, the signal 164, and/or the information related to the logic board 100 to further identify and/or characterize the logic board 100. For example, the operating parameters of the VSD 52 may be indicative of a size of the VSD 52, which may correspond to a particular logic board 100. Accordingly, the additional inputs 176 may provide further data and/or information that enables the microcontroller 172 to provide further identification information related to the particular logic board 100 used to control the VSD 52. Additionally or alternatively, the additional inputs 176 may be provided to an operator, such that the operator may assess whether the logic board 100 utilized to control the VSD 52 is appropriate based on the operating parameters of the VSD 52. In other words, the operator may determine whether the particular logic board 100 is sized and/or programmed to adequately control the size the VSD 52 with which it is installed.

In some embodiments, the microcontroller 172 may be communicatively coupled to an external memory device 178 and/or a communication interface 180. The external memory device 178 may include a secure digital (SD) card and/or another removable memory device that is accessible by an operator and is utilized to extract the information related to the logic board 100. As such, the operator may utilize the external memory device 178 to extract the information related to the logic board 100 and determine the identity of the logic board 100. Similarly, the communication interface 180 may output a third signal 182 (e.g., a wireless signal) toward an external computing device 184 (e.g., a phone, a computer, a tablet, a smart wearable device, a display, or another suitable computing device) via a wireless or wired communication technique (e.g., Wi-Fi, near field communication, Bluetooth, Zigbee, Z-wave, ISM, an embedded wireless module, another suitable wireless communication technique, or a wired connection). As such, the logic board 100 is configured to provide the identification information related to the particular logic board 100 to an operator (e.g., to the external computing device 184 of the operator), such that characteristics of the logic board 100 may be obtained quickly and efficiently by the operator.

Figure 7:
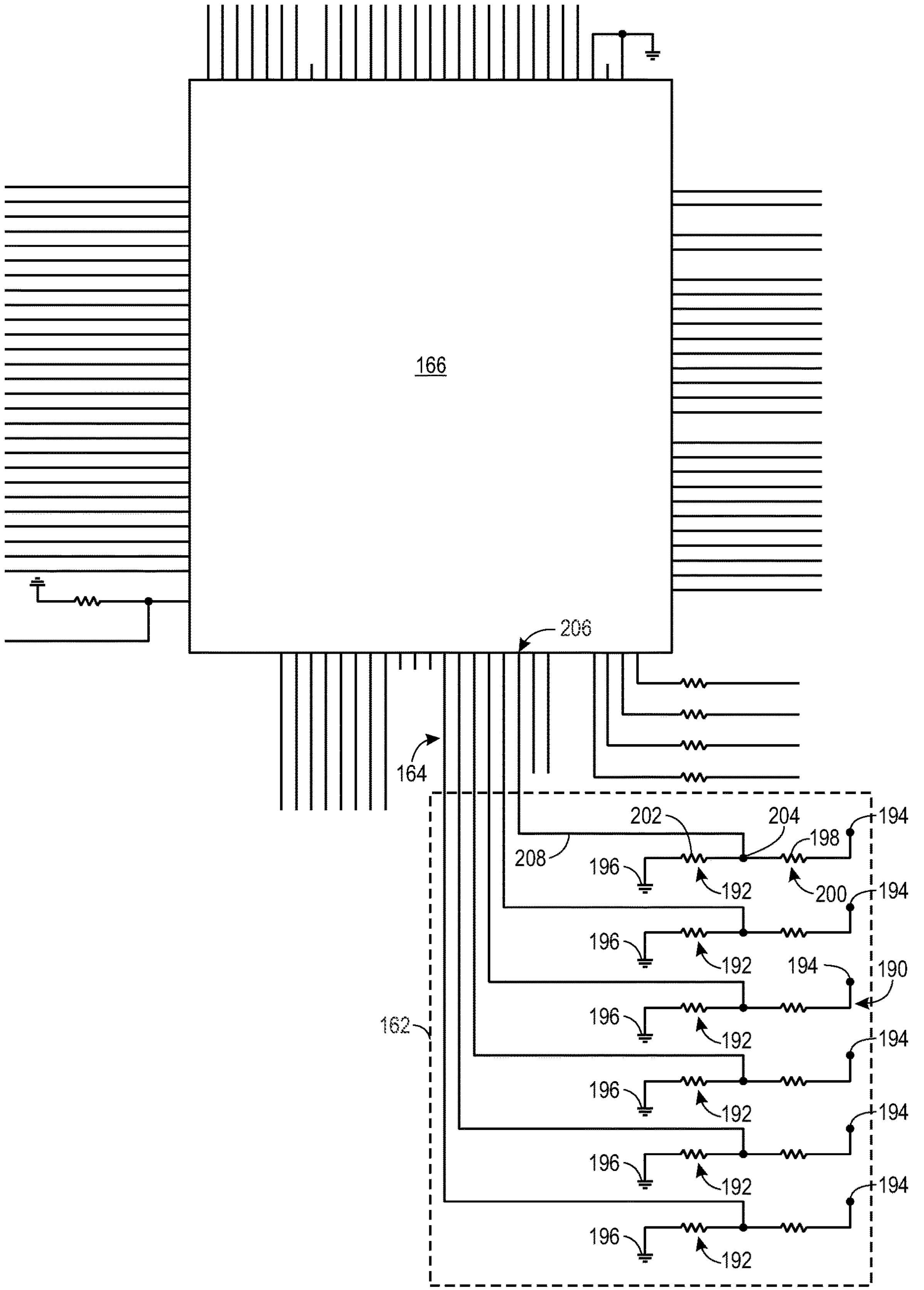
FIG. 7 is a schematic of a circuit diagram of a logic board identification system, in accordance with an aspect of the present disclosure.

As set forth above, the configuration block 162 may include a plurality of resistors 190 that is communicatively coupled to the control system 166 (e.g., a field programmable gate array) of the logic board 100. For example, FIG. 7 is a schematic of an embodiment of a circuit diagram of the electronic identification system 160 of the logic board 100. As shown in the illustrated embodiment of FIG. 7, the electronic identification system 160 includes the configuration block 162 having the plurality of resistors 190. The plurality of resistors 190 may include various or multiple sets of resistors 192 (e.g., a plurality of sets of resistors 192) that establish a voltage differential between a voltage source 194 and a ground connection 196. For example, a first resistor 198 of a first set of resistors 200 of the sets of resistors 192 is coupled to the voltage source 194, and a second resistor 202 of the first set of resistors 200 is coupled to the ground connection 196. A tap 204 between the first resistor 198 and the second resistor 202 may be coupled to an input 206 of the control system 166 and may direct a portion 208 of the signal 164 indicative of a voltage difference established between the first resistor 198 and the second resistor 202. As should be understood, each set of resistors of the various sets of resistors 192 is configured to provide respective portions 208 of the signal 164 to the control system 166. Accordingly, in the illustrated embodiment of FIG. 7, the signal 164 includes six portions 208, where each portion 208 is associated with one of six sets of resistors of the sets of resistors 192.

In some embodiments, the voltage source 194 may include a power source of the logic board 100 (e.g., the control system 166) and/or the VSD 52. As such, the voltage source 194 may include a single power source that is configured to direct a constant voltage toward each set of resistors of the sets of resistors 192. In other embodiments, the voltage source 194 may be a separate power source from the logic board 100 and/or the VSD 52. In any case, the voltage source 194 provides voltages (e.g., a single voltage or varying voltages) to each set of resistors of the sets of resistors 192. The sets of resistors 192 is configured to establish a voltage differential at the respective tap 204 of each set of resistors 192. Accordingly, each resistor of the plurality of resistors 190 may include different resistances that enable each set of resistors 192 to generate a target voltage differential that is ultimately directed to the control system 166.

In some embodiments, the target voltage differential established by a respective set of resistors 192 may represent a bit of data that is decoded and/or interpreted by the control system 166 to determine the identification information related to the logic board 100. For example, in some embodiments, the target voltage differentials may be indicative of a "0" or a "1," such that the portions 208 of the signal 164 together form a binary sequence. More specifically, a first set of resistors of the sets of resistors 192 may generate a target voltage differential that is greater than a threshold voltage differential, thereby representing a "1" as the bit of data transmitted to the control system 166. Additionally, a second set of resistors of the sets of resistors 192 may generate a target voltage differential that is less than a threshold voltage differential, thereby representing a "0" as the bit of data transmitted to the control system 166. Accordingly, each voltage differential received by the control system 166 from the sets of resistors 192 may represent a bit of a sequence of data indicative of the characteristics and/or features of the logic board 100. As shown in the illustrated embodiment of FIG. 7, the electronic identification system 160 includes six sets of resistors 192, such that the control system 166 receives six bits of data that form the sequence. In embodiments that utilize binary code, the control system 166 may receive sixty-four (e.g., $2^6$) different sequences, where each sequence represents a particular logic board 100. In other embodiments, the electronic identification system 160 may include any suitable number of sets of resistors 192 that enable the control system 166 to identify any suitable number of logic boards 100. Additionally or alternatively, the voltage differentials received by the control system 166 may not be in binary code format, such that a sequence of the actual voltage differentials (e.g., numeric values detected by the control system 166) may be associated with the logic board 100.

As set forth above, the control system 166 may decode the signal 164 received from the configuration block 162 and compare information (e.g., code, bits of data) from the signal 164 to identify the logic board 100. For instance, as set forth above, the control system 166 may compare a unique sequence decoded or extracted from the signal 164 to look-up tables stored in the memory 168 of the electronic identification system 160. The look-up tables may identify the particular logic board 100 and provide information indicative of an identity of the logic board 100 to the control system 166 and/or the microcontroller 172. As such, the control system 166 and/or the microcontroller 172 may determine specific information related to the logic board 100 and output the information to the external memory device 178 and/or generate the third signal 182 (e.g., via the communication interface 180), which may be received by an operator at the external computing device 184.

Figure 8:
FIG. 8 is a schematic representation of a decoded version of a signal that is configured to be output and/or otherwise used by a logic board identification system, in accordance with an aspect of the present disclosure.

FIG. 8 is a schematic diagram of an embodiment of a logic board identification code 220 that may be provided to an operator via the external memory device 178 and/or the communication interface 180. For example, the external computing device 184 may include a display that is configured to provide a visual representation of the logic board identification code 220. The operator may scan the logic board identification code 220 (e.g., similar to a bar code) to extract additional identification information associated with the particular logic board 100. As such, the operator may quickly identify the logic board 100 used in the VSD 52 of the HVAC&R system when performing installation and/or assembly, maintenance, and/or other procedural tasks on the HVAC&R system. In addition to the logic board identification code 220, the operator may receive further information related to the identity of the logic board 100 (e.g., information from the look-up tables that is provided to the operator via the external memory device and/or the third signal 182). In any case, the logic board identification code 220 and/or other information received by the operator may facilitate operations performed by the operator on the HVAC&R system and reduce assembly costs, maintenance costs, and/or maintenance time.

As shown in the illustrated embodiment of FIG. 8, the logic board identification code 220 may include a logic board identifier 222, a base number sequence 224, a board line number sequence 226, a BOM revision sequence 228, a unique identifier 230, and/or a bare PCB revision or layout identifier 232. The logic board identifier 222, illustrated as "031" in the embodiment of FIG. 8, may be any sequence of numbers, letters, or characters that represents all different types of logic boards 100. As should be understood, the sequence "031" is for illustrative purposes, and in other embodiments, the logic board identifier 222 may include any sequence of numbers, letters, and/or characters. In any case, the logic board identifier 222 may be the same regardless of the specific logic board 100 used for the VSD 52. In other words, the logic board identifier 222 is used to confirm that the electrical hardware controlling the VSD 52 and/or another device is indeed a logic board. The base number sequence 224 may be a unique sequence of numbers that may be associated with a particular logic board 100 and that may identify a function or functions of the logic board 100 with respect to the VSD 52. The base number sequence 224 may represent a model or series number, a type of logic board, a size, information related to circuitry, and/or other identifying information related to the logic board 100.

The board line number sequence 226 may be indicative of an application and/or use of the particular logic board 100. For example, the logic board 100 may be used to control the VSD 52 associated with the motor 50 that drives the compressor 32. In other embodiments, the logic board 100 may be utilized to control the VSD 52 associated with another component driven by a motor, another suitable variable frequency drive, and/or another application that may utilize logic boards. Accordingly, the operator may quickly identify whether the particular logic board 100 is being utilized for its intended purpose and/or application. The BOM revision sequence 228 may be indicative of specific components that are included in the particular logic board 100. For instance, the BOM revision sequence 228 may identify capacitors, resistors, inductors, transformers, power sources, circuit breakers, switches, fuses, and/or other suitable components that may be included in the logic board 100. Further, the unique identifier 230 may indicate and/or identify a deviation from a known BOM revision sequence 228. For instance, the BOM revision sequence 228 may include a predetermined sequence indicative of the components typically included in standard logic boards. The unique identifier 230 may include a sequence of characters, numbers, and/or letters that identify particular components of a specific logic board 100 that differ from the predetermined components associated with the BOM revision sequence 228. For example, the specific logic board 100 may include additional components, different sizes of components, and/or fewer components than those associated with the BOM revision sequence 228, such that the unique identifier 230 is configured to identify and/or provide an indication of such modifications to the particular logic board 100.

The bare PCB revision or layout identifier 232 may include information related to design parameters of the specific logic board 100. For example, the bare PCB revision or layout identifier 232 may include a sequence of characters, numbers, and/or letters indicating a layout of circuitry, artwork (e.g., data related to components and/or circuitry) of the logic board 100, and/or other suitable design parameters that are specific to the particular logic board 100. In any case, the logic board identification code 220 may be scanned or otherwise provided to the operator in electronic form to facilitate identification of the particular logic board 100 included in the VSD 52 to facilitate troubleshooting and/or maintenance of the VSD 52.

It should be understood that the application is not limited to the details or methodology set forth in the following description or illustrated in the figures. It should also be understood that the phraseology and terminology employed herein is for the purpose of description only and should not be regarded as limiting.

While the exemplary embodiments illustrated in the figures and described herein are presently preferred, it should be understood that these embodiments are offered by way of example only. Accordingly, the present application is not limited to a particular embodiment, but extends to various modifications that nevertheless fall within the scope of the appended claims. The order or sequence of any processes or method steps may be varied or re-sequenced according to alternative embodiments.

It is important to note that the construction and arrangement of the VSD and/or the logic board as shown in the various exemplary embodiments is illustrative only. Although only a few embodiments have been described in detail in this disclosure, those who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

The invention claimed is:

1. A logic board for a variable speed drive (VSD), comprising:

a configuration block comprising a plurality of resistors disposed between a voltage source and a ground point, wherein the plurality of resistors comprises a first pair of resistors configured to generate a first voltage differential between the voltage source and the ground point and a second pair of resistors configured to generate a second voltage differential between the voltage source and the ground point;

a control system communicatively coupled to the configuration block and configured to receive a signal comprising the first voltage differential and the second voltage differential from the configuration block, wherein the control system is configured to decode the signal to generate data indicative of an identity of the logic board; and a communication interface coupled to the control system, wherein the communication interface is configured to provide the data indicative of the identity of the logic board to an operator.

2. The logic board of claim 1, wherein the control system is configured to compare the first voltage differential, the second voltage differential, or both to a threshold voltage differential, and wherein the control system is configured to assign a numeric identifier to the first voltage differential, the second voltage differential, or both based on the comparison.

3. The logic board of claim 1, wherein the data indicative of the identity of the logic board comprises a logic board identification code.

4. The logic board of claim 3, wherein the logic board identification code comprises a logic board identifier, a base number sequence, a board line sequence, a BOM revision sequence, a unique identifier, a layout identifier, or any combination thereof.

5. The logic board of claim 1, wherein the communication interface comprises a wireless communication device, a portable memory device, a wired communication interface, or a combination thereof.

6. The logic board of claim 5, wherein the communication interface comprises the portable memory device, and wherein the portable memory device is a secure digital card.

7. The logic board of claim 1, comprising a microcontroller communicatively coupled to the control system, wherein the microcontroller is configured to receive operating data from the VSD and generate additional data indicative of the identity of the logic board based on the operating data.

8. The logic board of claim 1, wherein:

the first pair of resistors is configured to generate the first voltage differential at a first respective tap positioned between a first resistor of the first pair of resistors and a second resistor of the first pair of resistors, the second pair of resistors is configured to generate the second voltage differential at a second respective tap positioned between a first resistor of the second pair of resistors and a second resistor of the second pair of resistors, or both.

9. An electronic identification system of a logic board, comprising:

a power source of the logic board, wherein the power source is configured to output an electric voltage; and a plurality of resistors of the logic board, wherein the plurality of resistors is electrically coupled to the power source and communicatively coupled to a control system of the logic board, wherein a pair of resistors of the plurality of resistors is configured to establish a voltage differential between the power source and a ground point, the control system is configured to receive the voltage differential from the pair of resistors of the plurality of resistors, the plurality of resistors is configured to establish a sequence of voltage differentials, the control system is configured to receive a signal comprising the sequence of voltage differentials, and the control system is configured to decode the signal.

10. The electronic identification system of claim 9, wherein the voltage differential of the pair of resistors of the plurality of resistors is indicative of an identity of the logic board.

11. The electronic identification system of claim 9, wherein the power source is configured to provide at least a portion of the electric voltage to the control system.

12. The electronic identification system of claim 9, wherein the sequence of voltage differentials forms a binary code, and wherein the control system is configured to decode the binary code.

13. The electronic identification system of claim 9, wherein the plurality of resistors is arranged in pairs of resistors, including the pair of resistors, between the power source and the ground point, and wherein the pairs of resistors are configured to generate respective voltage differentials of the sequence of voltage differentials at respective taps positioned between a first resistor of a respective pair of resistors and a second resistor of the respective pair of resistors.

14. A method of identifying a logic board, comprising:

establishing a first voltage differential across a first pair of resistors disposed between a power source and a ground point;

establishing a second voltage differential across a second pair of resistors disposed between the power source and the ground point;

directing a signal indicative of the first voltage differential and the second voltage differential to a control system of the logic board; and decoding the signal to generate data indicative of an identity of the logic board.

15. The method of claim 14, wherein decoding the signal to generate the data indicative of the identity of the logic board comprises detecting a binary code associated with the first voltage differential and the second voltage differential.

16. The method of claim 14, wherein decoding the signal to generate data indicative of the identity of the logic board comprises generating a logic board identification code.

17. The logic board of claim 16, wherein the logic board identification code comprises a logic board identifier, a base number sequence, a board line sequence, a BOM revision sequence, a unique identifier, a layout identifier, or any combination thereof.

* * * * *